(12) United States Patent
Kojima et al.

(10) Patent No.: US 8,436,378 B2
(45) Date of Patent: May 7, 2013

(54) SEMICONDUCTOR LIGHT EMITTING DEVICE AND METHOD FOR MANUFACTURING SAME

(75) Inventors: Akihiro Kojima, Kanagawa-ken (JP); Yoshiaki Sugizaki, Kanagawa-ken (JP); Hideki Shibata, Kanagawa-ken (JP); Hideo Tamura, Kanagawa-ken (JP); Tetsuro Komatsu, Fukuoka-ken (JP); Masayuki Ishikawa, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 278 days.

(21) Appl. No.: 12/817,592

(22) Filed: Jun. 17, 2010

(65) Prior Publication Data

US 2011/0233585 A1 Sep. 29, 2011

(30) Foreign Application Priority Data

Mar. 25, 2010 (JP) .................................. 2010-069716

(51) Int. Cl.
*H01L 33/00* (2010.01)
(52) U.S. Cl.
USPC ................... 257/98; 438/29; 257/E33.059
(58) Field of Classification Search .................. 257/98, 257/99, E21.599, E33.005, E33.055, E33.059, 257/E33.066; 438/26, 29, 39, 46
See application file for complete search history.

(56) References Cited

U.S. PATENT DOCUMENTS

| 6,331,450 B1 | 12/2001 | Uemura |
| 2009/0072195 A1 | 3/2009 | Fukuda et al. |
| 2009/0096361 A1 | 4/2009 | Fukuda et al. |
| 2009/0179207 A1 | 7/2009 | Chitnis et al. |
| 2010/0025632 A1 | 2/2010 | Fukuda et al. |
| 2010/0038665 A1* | 2/2010 | Sugiura et al. ................. 257/98 |
| 2010/0148198 A1 | 6/2010 | Sugizaki et al. |
| 2011/0114986 A1* | 5/2011 | Kojima et al. ................. 257/99 |

FOREIGN PATENT DOCUMENTS

| JP | 2002-064112 | 2/2002 |
| JP | 2002-118293 | 4/2002 |
| JP | 2007-158298 | 6/2007 |
| JP | 2007-188962 | 7/2007 |
| JP | 2010-027768 | 2/2010 |
| WO | 2006068297 A1 | 6/2006 |

OTHER PUBLICATIONS

Extended European Search Report for Application No. 10167000.8-1226 issued Jun. 24, 2011.
European Examination Report for European Application No. 10167000.8 mailed Sep. 12, 2012.
Japanese Office Action for Japanese Application No. 2010-069716 mailed on May 7, 2012.
Examination report for European Application No. 10 167 000.8-1551 Dated Feb. 14, 2013, 6 pages.

* cited by examiner

*Primary Examiner* — Julio J Maldonado
*Assistant Examiner* — Sonya D McCall Shepard
(74) *Attorney, Agent, or Firm* — Turocy & Watson, LLP

(57) ABSTRACT

According to one embodiment, a semiconductor light emitting device includes a semiconductor layer, a first electrode, a second electrode, an insulating film, a first interconnection, a second interconnection, a first metal pillar, a second metal pillar, a resin, and a fluorescent layer. The semiconductor layer has a first major surface, a second major surface formed on an opposite side to the first major surface, and a light emitting layer. The first electrode and the second electrode are provided on the second major surface of the semiconductor layer. The fluorescent layer faces to the first major surface of the semiconductor layer and includes a plurality of kinds of fluorescent materials having different peak wavelengths of emission light.

22 Claims, 7 Drawing Sheets

SEMICONDUCTOR LIGHT EMITTING DEVICE AND METHOD FOR MANUFACTURING SAME

CROSS-REFERENCE TO RELATED APPLICATION

This application is based upon and claims the benefit of priority from Japanese Patent Application No. 2010-069716, filed on Mar. 25, 2010; the entire contents of which are incorporated herein by reference.

BACKGROUND

Light emitting devices capable of emitting visible and white light are expanding their applications to, for instance, illumination devices, display devices, and backlight sources for image display devices.

In these applications, there is a growing demand for downsizing. In this context, downsizing of electronic devices has been facilitated by an SMD (surface-mounted device) light emitting device in which a light emitting element chip is bonded onto a lead frame and molded with resin.

To replace fluorescent lamps and incandescent bulbs by illumination devices based on semiconductor light emitting devices with low power loss, it is necessary to enhance mass productivity and reduce cost.

An example technique for further downsizing is disclosed. In this example technique, a light emitting element chip is flip-chip connected to an interconnect layer provided on a transparent substrate so as to be externally driven via a columnar electrode and a ball. On the transparent substrate, the light emitting element chip and the columnar electrode are covered with a sealant.

However, this example needs the interconnect layer and the columnar electrode for bonding the light emitting element chip onto the transparent substrate with high positional accuracy, and it is insufficient to meet the requirements for downsizing and mass productivity.

Furthermore, in a fluorescent-conversion white LED (light emitting diode), wavelength conversion of excitation light by the fluorescent material cannot avoid Stokes loss in which the energy difference between the excitation light and the fluorescent-emitted light is lost as heat. Thus, efficiency improvement by controlling the fluorescent material is desired.

DETAILED DESCRIPTION

According to one embodiment, a semiconductor light emitting device includes a semiconductor layer, a first electrode, a second electrode, an insulating film, a first interconnection, a second interconnection, a first metal pillar, a second metal pillar, a resin, and a fluorescent layer. The semiconductor layer has a first major surface, a second major surface formed on an opposite side to the first major surface, and a light emitting layer. The first electrode is provided on the second major surface of the semiconductor layer. The second electrode is provided on the second major surface of the semiconductor layer. The insulating film is provided on a side of the second major surface of the semiconductor layer and includes a first opening reaching the first electrode and a second opening reaching the second electrode. The first interconnection is provided on a surface of the insulating film on the opposite side to the semiconductor layer and in the first opening and is connected to the first electrode. The second interconnection is provided on a surface of the insulating film on the opposite side to the semiconductor layer and in the second opening and is connected to the second electrode. The first metal pillar is provided on a surface of the first interconnection on an opposite side to the first electrode. The second metal pillar is provided on a surface of the second interconnection on an opposite side to the second electrode. The resin covers a periphery of the first metal pillar and a periphery of the second metal pillar. The fluorescent layer faces to the first major surface of the semiconductor layer and includes a plurality of kinds of fluorescent materials having different peak wavelengths of emission light.

Embodiments will now be described with reference to the drawings.

Figure 1:
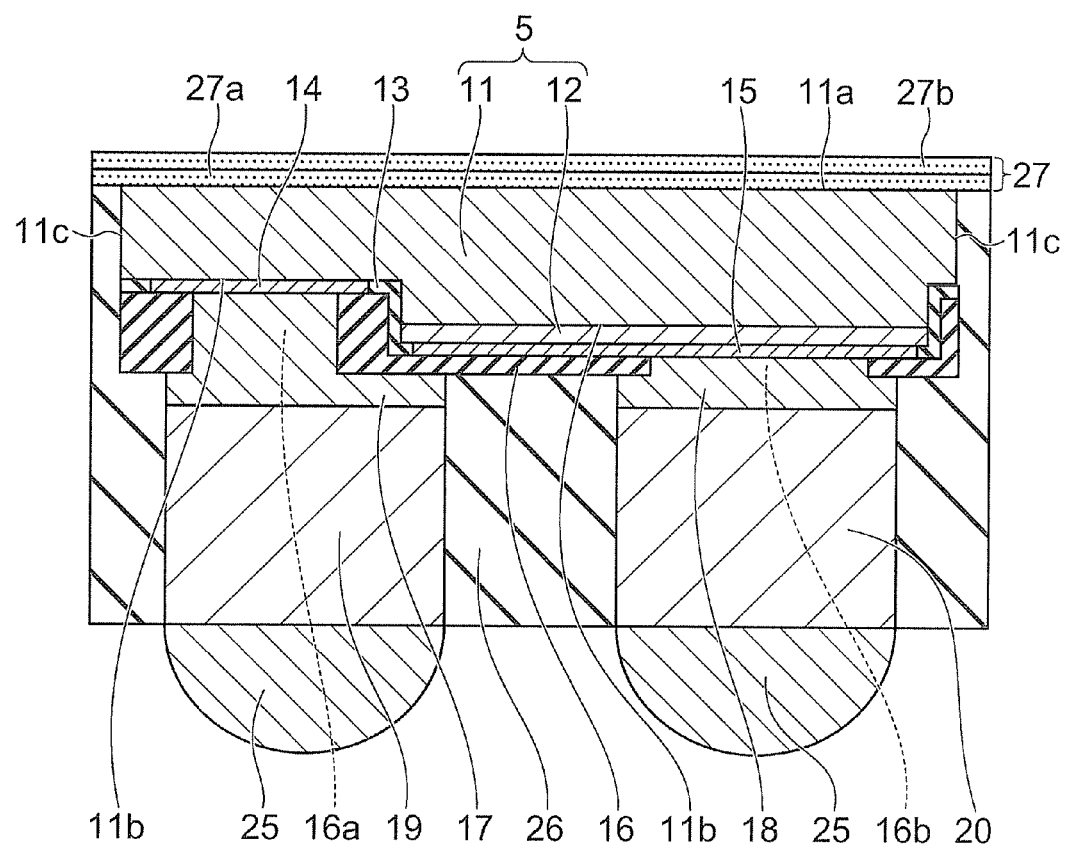
FIG. 1 is a schematic cross-sectional view of a semiconductor light emitting device of an embodiment.

FIG. 1 is a schematic cross-sectional view of a semiconductor light emitting device of an embodiment.

The semiconductor light emitting device of this embodiment includes a semiconductor layer 5, a package structure section including interconnections, sealing resin and the like, and a fluorescent layer 27, which are formed collectively in wafer state. The semiconductor layer 5 includes a first semiconductor layer 11 and a second semiconductor layer 12. The first semiconductor layer 11 is illustratively an n-type GaN layer and functions as a lateral current path. However, the conductivity type of the first semiconductor layer 11 is not limited to n-type, but may be p-type.

Light is extracted to the outside mainly from the first major surface 11a of the first semiconductor layer 11. The second semiconductor layer 12 is provided on the second major surface 11b of the first semiconductor layer 11 on the opposite side to the first major surface 11a.

Figure 2:
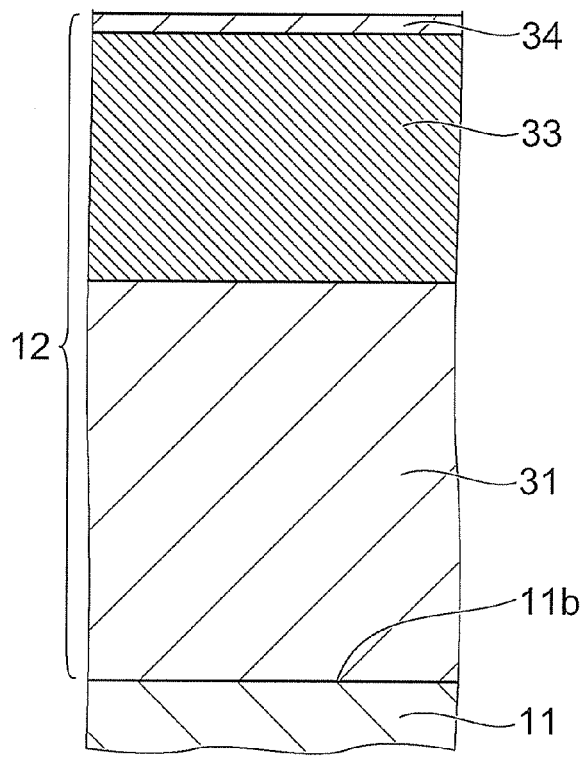
FIG. 2 is an enlarged sectional view of a relevant part in FIG. 1.

The second semiconductor layer 12 has a stacked structure of a plurality of semiconductor layers including a light emitting layer (active layer). FIG. 2 shows an example of this structure. It is noted that FIG. 2 is vertically inverted from FIG. 1.

An n-type GaN layer 31 is provided on the second major surface 11b of the first semiconductor layer 11. A light emitting layer 33 is provided on the GaN layer 31. The light emitting layer 33 illustratively has a multiple quantum well structure including InGaN. A p-type GaN layer 34 is provided on the light emitting layer 33.

As shown in FIG. 1, a protrusion and a depression are provided on the second major surface 11b side of the first semiconductor layer 11. The second semiconductor layer 12 is provided on the surface of the protrusion. Hence, the protrusion includes the stacked structure of the first semiconductor layer 11 and the second semiconductor layer 12.

The bottom surface of the depression is the second major surface 11b of the first semiconductor layer 11, and an n-side electrode 14 is provided as a first electrode on the second major surface 11b of the depression.

A p-side electrode 15 is provided as a second electrode on the opposite surface of the second semiconductor layer 12 with respect to the surface in contact with the first semiconductor layer 11.

The second major surface 11b of the first semiconductor layer 11 is covered with an insulating film 13 such as silicon oxide film. The n-side electrode 14 and the p-side electrode 15 are exposed from the insulating film 13. The n-side electrode 14 and the p-side electrode 15 are insulated by the insulating film 13 and serve as electrodes electrically independent of each other. Furthermore, the insulating film 13 also covers the side surface of the protrusion including the second semiconductor layer 12.

An insulating film 16 is provided on the second major surface 11b side so as to cover the insulating film 13, part of the n-side electrode 14, and part of the p-side electrode 15. The insulating film 16 is illustratively made of silicon oxide film or resin.

The surface of the insulating film 16 on the opposite side to the first semiconductor layer 11 and the second semiconductor layer 12 is planarized, and an n-side interconnection 17 as a first interconnection and a p-side interconnection 18 as a second interconnection are provided on that surface.

The n-side interconnection 17 is provided also in the opening 16a formed in the insulating film 16 and reaching the n-side electrode 14 and is electrically connected to the n-side electrode 14. The p-side interconnection 18 is provided also in the opening 16b formed in the insulating film 16 and reaching the p-side electrode 15 and is electrically connected to the p-side electrode 15.

For instance, the n-side interconnection 17 and the p-side interconnection 18 are simultaneously formed by a plating process in which a seed metal formed on the surface of the insulating film 16 including the inner wall surfaces of the openings 16a and 16b is used as a current path.

The n-side electrode 14, the p-side electrode 15, the n-side interconnection 17, and the p-side interconnection 18 are all provided on the second major surface 11b side of the first semiconductor layer 11 and constitute a interconnect layer for supplying a current to the light emitting layer.

An n-side metal pillar 19 is provided as a first metal pillar on the surface of the n-side interconnection 17 on the opposite side to the n-side electrode 14. A p-side metal pillar 20 is provided as a second metal pillar on the surface of the p-side interconnection 18 on the opposite side to the p-side electrode 15. The periphery of the n-side metal pillar 19, the periphery of the p-side metal pillar 20, the n-side interconnection 17, and the p-side interconnection 18 are covered with a resin 26. Furthermore, the resin 26 covers also the side surface 11c of the first semiconductor layer 11. Thus, the side surface 11c of the first semiconductor layer 11 is protected by the resin 26.

A contact area between the n-side interconnection 17 and the n-side metal pillar 19 is larger than a contact area between the n-side interconnection 17 and the n-side electrode 14. A contact area between the p-side interconnection 18 and the p-side metal pillar 20 is larger than a contact area between the p-side interconnection 18 and the p-side electrode 15.

The first semiconductor layer 11 is electrically connected to the n-side metal pillar 19 via the n-side electrode 14 and the n-side interconnection 17. The second semiconductor layer 12 is electrically connected to the p-side metal pillar 20 via the p-side electrode 15 and the p-side interconnection 18. External terminals 25 such as solder balls and metal bumps are provided on the lower end surfaces of the n-side metal pillar 19 and the p-side metal pillar 20 exposed from the resin 26, and the semiconductor light emitting device can be electrically connected to external circuits via the external terminals 25.

The thickness of the n-side metal pillar 19 (a thickness in a vertical direction in FIG. 1) is thicker than the thickness of the stacked body including the semiconductor layer 5, the n-side electrode 14, the p-side electrode 15, the insulating films 13 and 16, the n-side interconnection 17, and the p-side interconnection 18. Likewise, the thickness of the p-side metal pillar 20 is also thicker than the thickness of the aforementioned stacked body. The aspect ratio (the ratio of thickness to planar size) of each of the metal pillars 19 and 20 is not limited to one or more, but the ratio may be less than one. That is, the thickness of the metal pillars 19 and 20 may be smaller than its planar size.

In the structure of this embodiment, even if the semiconductor layer 5 is thin, its mechanical strength can be maintained by thickening the n-side metal pillar 19, the p-side metal pillar 20, and the resin 26. Furthermore, the n-side metal pillar 19 and the p-side metal pillar 20 can absorb and relax the stress applied to the semiconductor layer 5 via the external terminals 25 when the device is mounted on a circuit board or the like. Preferably, the resin 26 serving to reinforce the n-side metal pillar 19 and the p-side metal pillar 20 has a thermal expansion coefficient, which is equal or close to that of the circuit board and the like. Examples of such a resin 26 include epoxy resin, silicone resin, and fluororesin.

The n-side interconnection 17, the p-side interconnection 18, the n-side metal pillar 19, and the p-side metal pillar 20 can be made of such a material as copper, gold, nickel, and silver. Among them, it is more preferable to use copper, which has good thermal conductivity, high migration resistance, and superior contact with insulating films.

The fluorescent layer 27 is provided on the first major surface 11a of the first semiconductor layer 11. The fluorescent layer 27 is provided with a generally uniform thickness in the plane direction of the first major surface 11a. Light emitted from the light emitting layer passes mainly the first semiconductor layer 11, the first major surface 11a and the fluorescent layer 27, and is emitted to the outside.

The fluorescent layer 27 can absorb the light (excitation light) from the light emitting layer and emit wavelength-converted light. Thus, it is possible to emit mixed light of the light from the light emitting layer and the wavelength-converted light of the fluorescent layer 27.

The fluorescent layer 27 has a structure in which a plurality of kinds of fluorescent materials are dispersed in a transparent resin. The transparent resin is transmissive to light emitted by the light emitting layer and the fluorescent materials and is illustratively silicone resin.

The plurality of kinds of fluorescent materials include ones, which are excited by light from the light emitting layer and emit light at different peak wavelengths. Relatively, the fluorescent materials having a longer peak wavelength are provided nearer to the first major surface. The fluorescent materials having different peak wavelengths are layered along the thickness of the fluorescent layer 27.

The fluorescent layer 27 includes a first fluorescent layer 27a provided on the first major surface 11a and containing a first fluorescent material and a second fluorescent layer 27b provided on the first fluorescent layer 27a. The second fluorescent layer 27b contains a second fluorescent material having a shorter peak wavelength of emission light than the first fluorescent material. Here, the fluorescent layer 27 may have a stacked structure of three or more layers.

By allowing the fluorescent layer 27 to contain a plurality of kinds of fluorescent materials having different peak wavelengths of emission light, high color rendering property (the property of a light source determining the apparent color of an object illuminated thereby) can be obtained. Furthermore, by using a light emitting layer emitting blue light and using as the fluorescent materials a red fluorescent material emitting red light and a green fluorescent material emitting green light, a white color or lamp color with high color rendering property can be obtained as mixture of the blue light, red light, and green light.

In this layered structure, the first fluorescent layer 27a containing a red fluorescent material as a first fluorescent material is provided on the first major surface 11a side from which light from the light emitting layer is emitted, and the second fluorescent layer 27b containing a green fluorescent material as a second fluorescent material having a shorter light emission peak wavelength is provided thereon. Thus, the emission light of the fluorescent material is not consumed to excite other kinds of fluorescent materials, and the efficiency decrease can be suppressed. Consequently, highly efficient light emission characteristics can be achieved.

Emission light with a desired color can be obtained by adjusting the density of the green fluorescent material and red fluorescent material and the thickness of the fluorescent layers containing them.

As the fluorescent materials, by using fluorescent materials in which SiAlON compounds as illustrated below are doped with emission center elements, the temperature characteristics of wavelength conversion efficiency is improved, and the efficiency in the high current density region can be further improved. Furthermore, the green SiAlON fluorescent material and red SiAlON fluorescent material are excited with high efficiency by blue light. Hence, by combination with a light emitting layer emitting blue light, a highly efficient light emitting device with various shades can be obtained.

As compared with the combination of a yellow fluorescent material with blue excitation light, the combination of a red SiAlON fluorescent material and a green SiAlON fluorescent material with blue excitation light is more preferable to obtain a white color with higher color rending property and, it also suppresses degradation at high temperatures.

Furthermore, the red SiAlON fluorescent material has a broad light emission spectrum, allowing excitation with high efficiency across a wide excitation bandwidth from ultraviolet to blue light, and is suitable particularly for a white LED.

For instance, the first fluorescent layer 27a contains, as a first fluorescent material (red fluorescent material), a fluorescent material which exhibits a light emission peak at a wavelength ranging from 580 to 700 nm when excited by light with a wavelength of 250 to 500 nm and satisfies the following formula (1).

$$(M_{1-x}R_x)_{a1}AlSi_{b1}O_{c1}N_{d1} \quad (1)$$

In the above formula (1), M is at least one metallic element except Si and Al and is preferably at least one of Ca and Sr in particular. R is an emission center element and is preferably Eu in particular.

For instance, M is at least one selected from the group consisting of Mg, Ca, Sr, Ba, Y, Gd, La, Lu, Sc, Li, Na, K, B, Ga, In, and Ge. R is at least one selected from the group consisting of Eu, Ce, Mn, Tb, Yb, Dy, Sm, Tm, Pr, Nd, Pm, Ho, Er, Gd, Cr, Sn, Cu, Zn, Ga, Ge, As, Ag, Cd, In, Sb, Au, Hg, Tl, Pb, Bi, and Fe. Here, x, a1, b1, c1, and d1 satisfy the relations $0<x\leqq 1$, $0.6<a1<0.95$, $2<b1<3.9$, $0.25<c1<0.45$, and $4<d1<5.7$.

Use of SiAlON fluorescent materials represented by the above composition formula (1) can improve the temperature characteristics of wavelength conversion efficiency and further increase the efficiency in the high current density region.

Furthermore, for instance, the second fluorescent layer 27b contains, as a second fluorescent material (green fluorescent material), a fluorescent material which exhibits a light emission peak at a wavelength ranging from 490 to 580 nm when excited by light with a wavelength of 250 to 500 nm and satisfies the following formula (2).

$$(M_{1-x}R_x)_{a2}AlSi_{b2}O_{c2}N_{d2} \quad (2)$$

In the above formula (2), M is at least one metallic element except Si and Al and is preferably at least one of Ca and Sr in particular. R is an emission center element and is preferably Eu in particular.

For instance, M is at least one selected from the group consisting of Mg, Ca, Sr, Ba, Y, Gd, La, Lu, Sc, Li, Na, K, B, Ga, In, and Ge. R is at least one selected from the group consisting of Eu, Ce, Mn, Tb, Yb, Dy, Sm, Tm, Pr, Nd, Pm, Ho, Er, Gd, Cr, Sn, Cu, Zn, Ga, Ge, As, Ag, Cd, In, Sb, Au, Hg, Tl, Pb, Bi, and Fe. Here, x, a2, b2, c2, and d2 satisfy the relations $0<x\leqq 1$, $0.93<a2<1.3$, $4.0<b2<5.8$, $0.6<c2<1$, and $6<d2<11$.

Use of SiAlON fluorescent materials represented by the above composition formula (2) can improve the temperature characteristics of wavelength conversion efficiency and further increase the efficiency in the high current density region.

Alternatively, for instance, the second fluorescent layer 27b contains, as a second fluorescent material (green fluorescent material), a fluorescent material which exhibits a light emission peak at a wavelength ranging from 490 to 580 nm when excited by light with a wavelength of 250 to 500 nm and satisfies the following formula (3).

$$(M_{1-x}R_x)_{a2}AlSi_{b2}O_{c2}N_{d2} \quad (3)$$

In the Above General Formula (3), M is at Least One metallic element except Si and Al and is preferably at least one of Ca and Sr in particular. R is an emission center element and is preferably Eu in particular.

For instance, M is at least one selected from the group consisting of Mg, Ca, Sr, Ba, Y, Gd, La, Lu, Sc, Li, Na, K, B, Ga, In, and Ge. R is at least one selected from the group consisting of Eu, Ce, Mn, Tb, Yb, Dy, Sm, Tm, Pr, Nd, Pm, Ho, Er, Gd, Cr, Sn, Cu, Zn, Ga, Ge, As, Ag, Cd, In, Sb, Au, Hg, Tl, Pb, Bi, and Fe. Here, x, a2, b2, c2, and d2 satisfy the relations $0<x\leqq 1$, $0.94<a2<1.1$, $4.1<b2<4.7$, $0.7<c2<0.85$, and $7<d2<9$.

Use of SiAlON fluorescent materials represented by the above composition formula (3) can improve the temperature characteristics of wavelength conversion efficiency and further increase the efficiency in the high current density region.

By using the fluorescent materials represented by the above composition formulas, thermal degradation can be suppressed.

Furthermore, even higher color rending property can be achieved by further adding a yellow fluorescent material to the aforementioned red fluorescent material and green fluorescent material. The yellow fluorescent material can illustratively be a silicate fluorescent material such as $(Sr,Ca,Ba)_2SiO_4$:Eu.

It is noted that the red fluorescent material may illustratively be a nitride fluorescent material such as $CaAlSiN_3$:Eu. Furthermore, the green fluorescent material may illustratively be a halophosphate fluorescent material such as $(Ba,Ca,Mg)_{10}(PO_4)_6.Cl_2$:Eu.

Furthermore, the plurality of kinds of fluorescent materials may include a blue fluorescent material. The blue fluorescent material can illustratively be an oxide fluorescent material such as $BaMgAl_{10}O_{17}$:Eu.

Next, a method for manufacturing a semiconductor light emitting device of this embodiment is described with reference to FIGS. 3, and 4A to 7B.

Figure 4A:
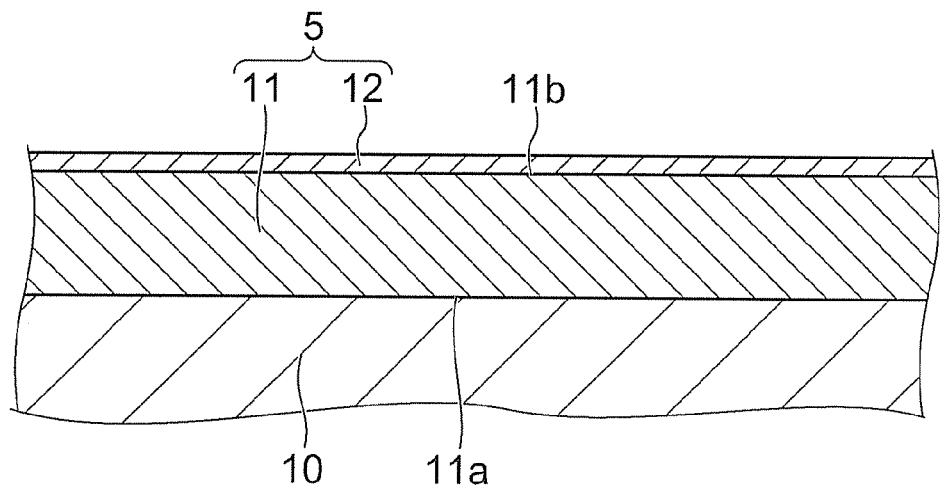
FIGS. 4A to 7B are schematic cross-sectional views of a method for manufacturing a semiconductor light emitting device of the embodiment.

First, as shown in FIG. 4A, a first semiconductor layer 11 is formed on the major surface of a substrate 10. The surface of the first semiconductor layer 11 on the substrate 10 side corresponds to the first major surface 11a. Next, a second semiconductor layer 12 is formed on the second major surface 11b of the substrate 10 on the opposite side to the first major surface 11a. For instance, in the case where the light emitting layer is made of a nitride semiconductor, the stacked body of the first semiconductor layer 11 and the second semiconductor layer 12 can be grown as a crystal on a sapphire substrate.

Figure 4B:
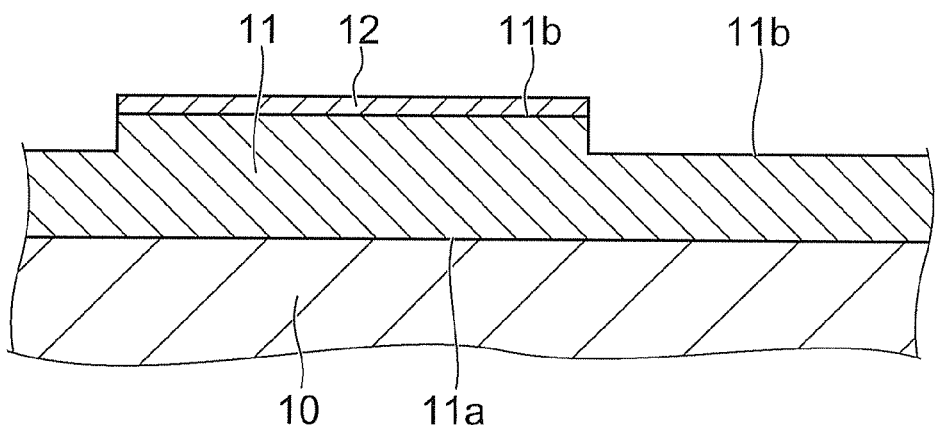

Next, for instance, an RIE (reactive ion etching) process using a resist, not shown, is used to selectively remove part of the second semiconductor layer 12 and the first semiconductor layer 11. Thus, as shown in FIG. 4B, a depression and a protrusion are formed on the second major surface 11b side of the first semiconductor layer 11. The portion from which part of the second semiconductor layer 12 and the first semiconductor layer 11 are removed constitutes the depression, and the portion where the second semiconductor layer 12 including the light emitting layer is left constitutes the protrusion. The second major surface 11b of the first semiconductor layer 11 is exposed to the bottom of the depression.

Figure 4C:
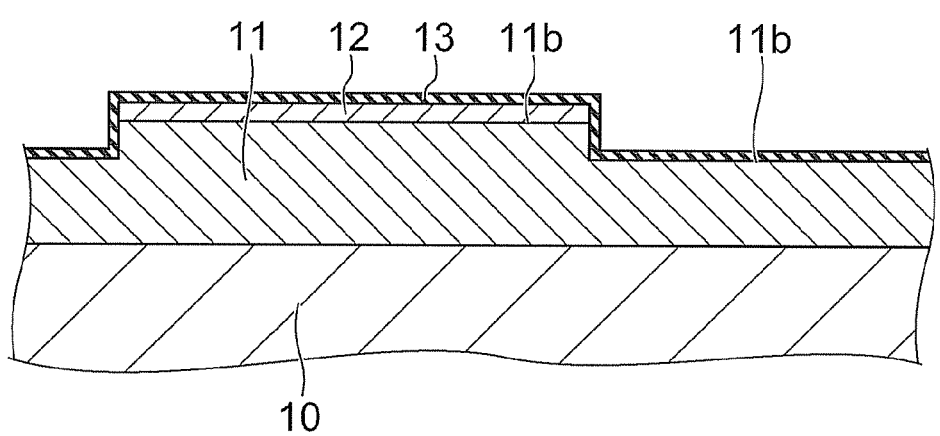

Next, as shown in FIG. 4C, the entire surface of the second major surface 11b of the first semiconductor layer 11 and the second semiconductor layer 12 are covered with an insulating film 13. The insulating film 13 is formed illustratively by a CVD (chemical vapor deposition) process.

Figure 5A:
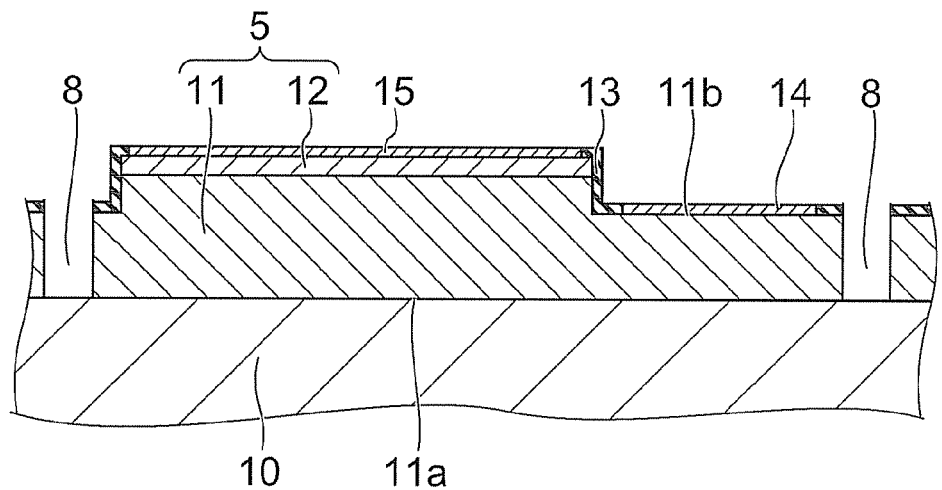

Next, openings are selectively formed in the insulating film 13. As shown in FIG. 5A, a p-side electrode 15 is formed on the second semiconductor layer 12 of the protrusion, and an n-side electrode 14 is formed on the second major surface 11b of the first semiconductor layer 11 in the depression.

Figure 3:
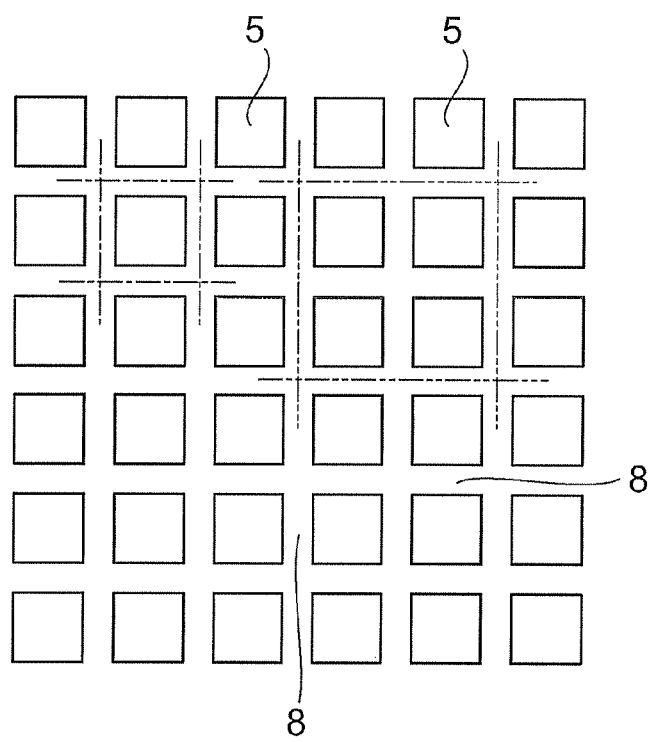
FIG. 3 is a schematic plain view of a method for manufacturing a semiconductor light emitting device of the embodiment in wafer state.

Furthermore, a trench 8 piercing the insulating film 13 and the first semiconductor layer 11 and reaching the substrate 10 is formed. The trench 8 separates the first semiconductor layer 11 into a plurality on the substrate 10. The trench 8 is formed illustratively like a lattice in the wafer surface as shown in FIG. 3. Thereby, a plurality of chips (semiconductor layers) 5 surrounded by the trench 8 are formed.

Figure 5B:
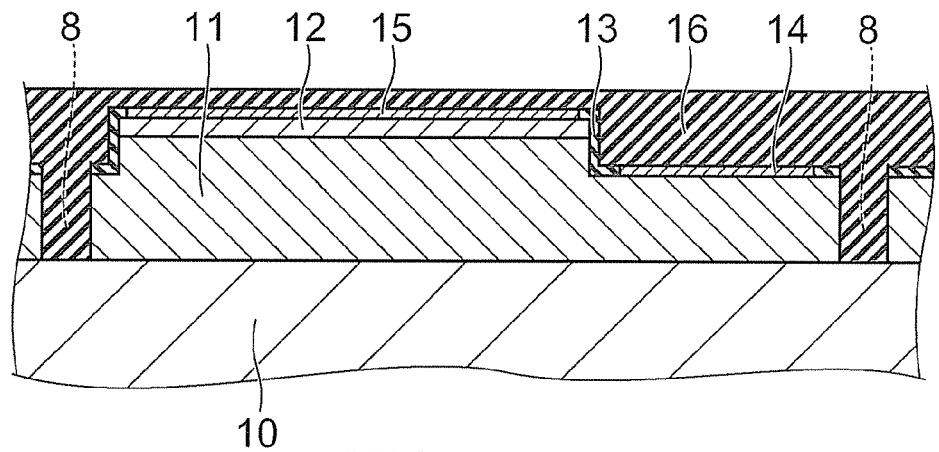

Next, as shown in FIG. 5B, an insulating film 16 covering the n-side electrode 14, the p-side electrode 15, and the insulating film 13 is formed. The insulating film 16 is buried in the trench 8.

Figure 5C:
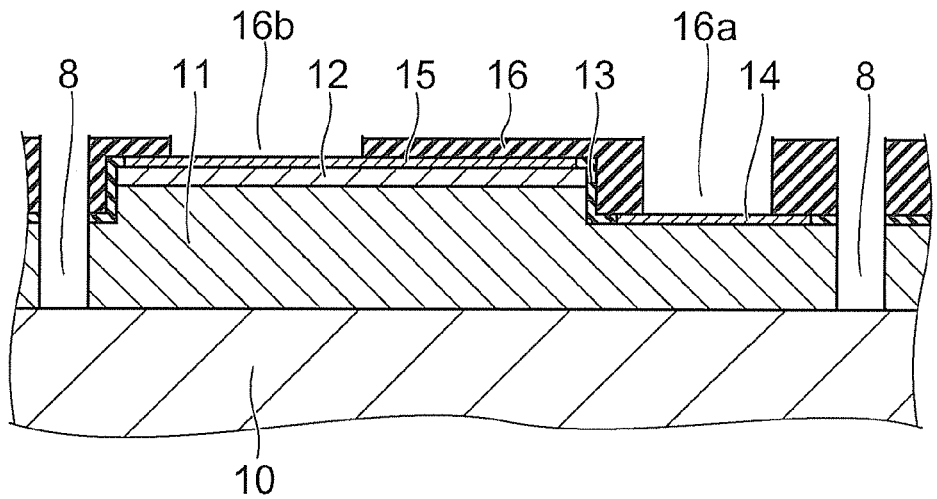

After the insulating film 16 is formed, as shown in FIG. 5C, an opening 16a reaching the n-side electrode 14 and an opening 16b reaching the p-side electrode 15 are formed in the insulating film 16 illustratively by using a hydrofluoric acid solution. The insulating film 16 in the trench 8 is also removed.

Next, a seed metal, not shown, is formed on the upper surface of the insulating film 16 and the inner wall (side surfaces and bottom surfaces) of the openings 16a and 16b, and a plating resist, not shown, is further formed. Then, Cu plating is performed using the seed metal as a current path. The seed metal illustratively includes Cu. Furthermore, the plating resist, not shown, is provided in the trench 8.

Figure 6A:
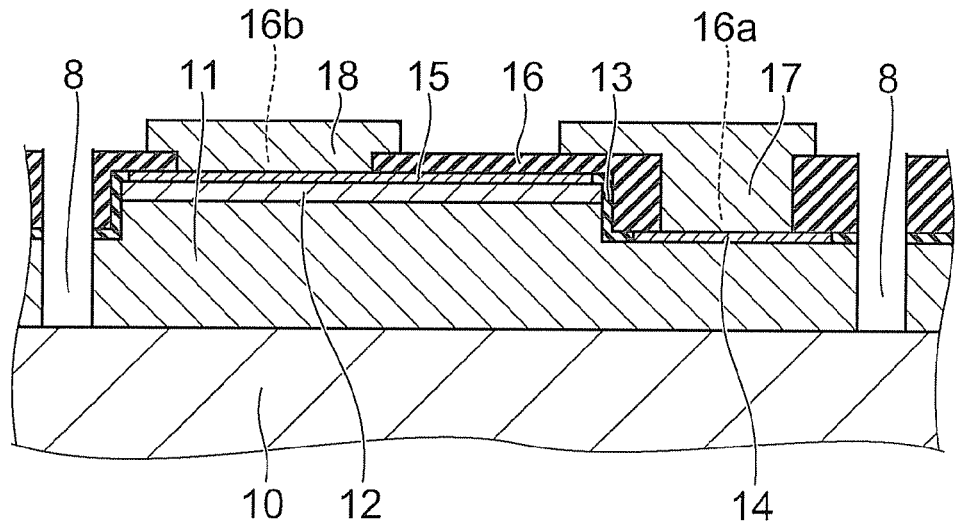

Thus, as shown in FIG. 6A, an n-side interconnection 17 and a p-side interconnection 18 are selectively formed on the upper surface (the surface on the opposite side to the first semiconductor layer 11 and the second semiconductor layer 12) of the insulating film 16. The n-side interconnection 17 is formed also in the opening 16a and connected to the n-side electrode 14. The p-side interconnection 18 is formed also in the opening 16b and connected to the p-side electrode 15.

Figure 6B:
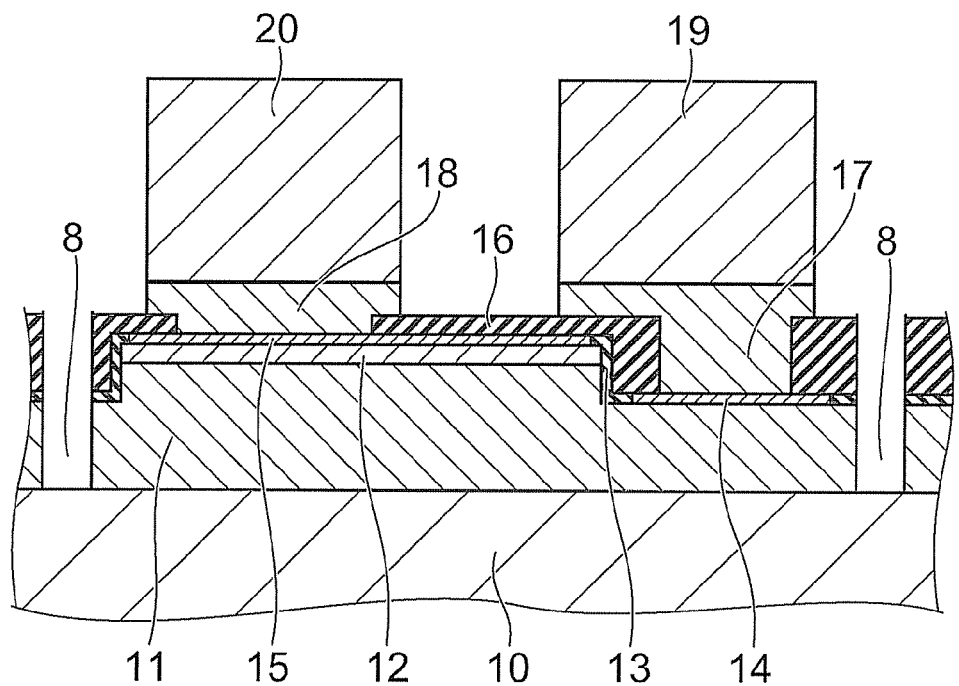

Next, the plating resist used for the plating of the n-side interconnection 17 and the p-side interconnection 18 is removed with chemicals. Then, another plating resist for forming metal pillars is formed, and electrolytic plating is performed using the aforementioned seed metal as a current path. Also at this time, the plating resist is provided in the trench 8. Thus, as shown in FIG. 6B, an n-side metal pillar 19 is formed on the n-side interconnection 17, and a p-side metal pillar 20 is formed on the p-side interconnection 18.

Subsequently, the plating resist for forming metal pillars is removed with chemicals, and furthermore the exposed portion of the seed metal is removed. This breaks the electrical connection between the n-side interconnection 17 and the p-side interconnection 18 via the seed metal.

Figure 7A:
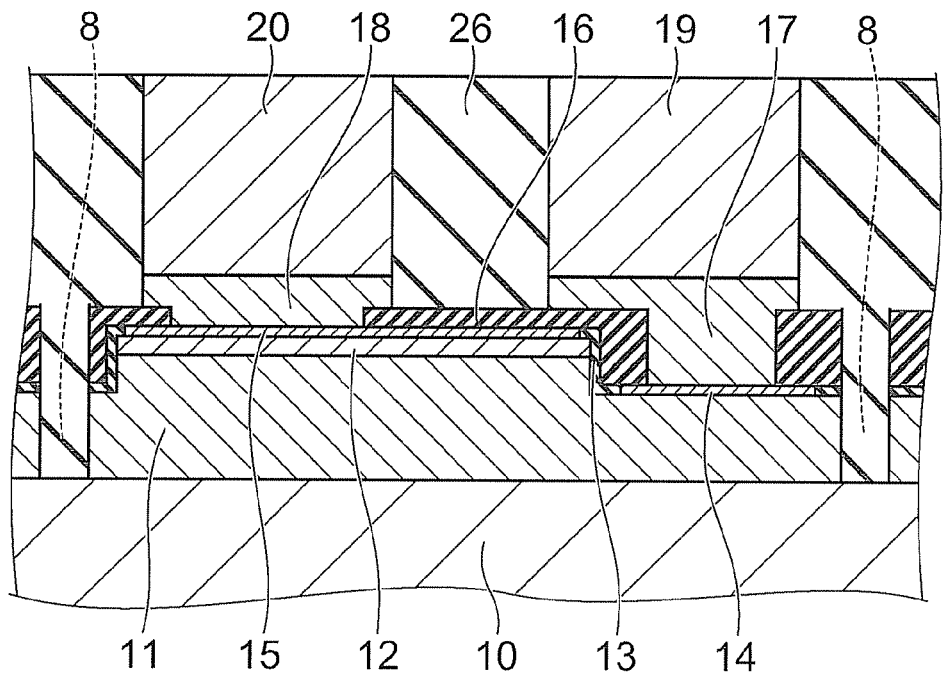

Next, as shown in FIG. 7A, the n-side interconnection 17, the p-side interconnection 18, the n-side metal pillar 19, the p-side metal pillar 20, and the insulating film 16 are covered with a resin 26. Furthermore, at this time, part of the resin 26 is buried also in the trench 8.

Subsequently, the surface of the resin 26 is ground to expose the end surfaces of the n-side metal pillar 19 and the p-side metal pillar 20. Then, external terminals 25 (FIG. 1) such as solder balls and metal bumps are provided on the exposed surfaces.

Figure 7B:
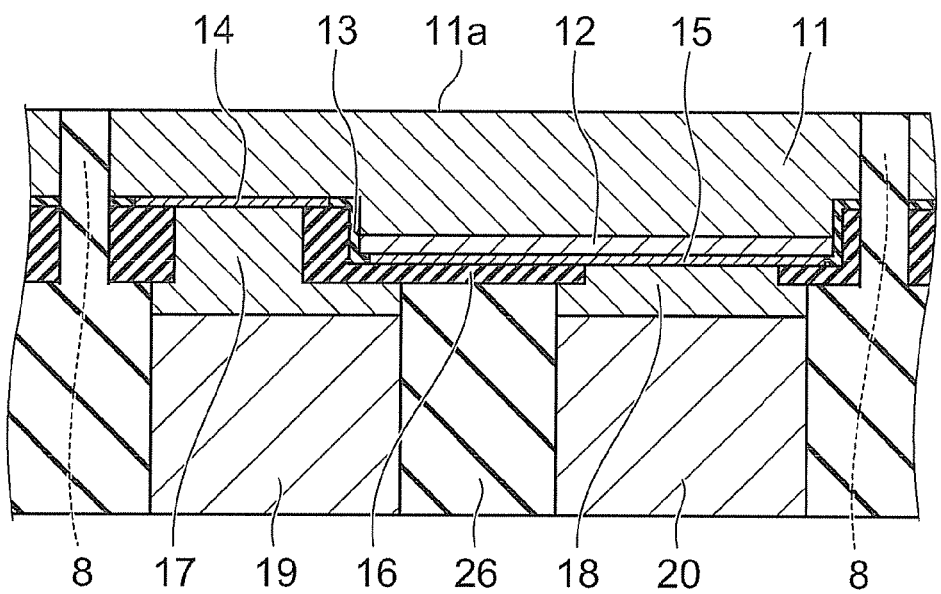

Next, as shown in FIG. 7B, the substrate 10 is removed. It is noted that FIG. 7B is vertically inverted from FIG. 7A.

The substrate 10 is removed from the first semiconductor layer 11 illustratively by a laser lift-off process. Specifically, laser light is applied toward the first semiconductor layer 11 from the rear surface side of the substrate 10, which is the surface opposite to its major surface on which the first semiconductor layer 11 is formed. The laser light has a wavelength to which the substrate 10 is transmissive and which falls in an absorption region of the first semiconductor layer 11.

When the laser light reaches the interface between the substrate 10 and the first semiconductor layer 11, the first semiconductor layer 11 near the interface is decomposed by absorbing the energy of the laser light. For instance, in the case where the first semiconductor layer 11 is made of GaN, it is decomposed into Ga and nitrogen gas. This decomposition reaction forms a small gap between the substrate 10 and the first semiconductor layer 11 and separates the substrate 10 from the first semiconductor layer 11. Irradiation with laser light is performed multiple times on predefined regions throughout the wafer to remove the substrate 10.

After the substrate 10 is removed, as shown in FIG. 1, a fluorescent layer 27 is formed on the first major surface 11a of the first semiconductor layer 11.

For instance, a paste-like transparent resin in which a first fluorescent material is dispersed is supplied onto the first major surface 11a by a printing process, and then the transparent resin is cured. Thus, a first fluorescent layer 27a is formed on the first major surface 11a. Subsequently, a paste-like transparent resin in which a second fluorescent material is dispersed is supplied onto the first fluorescent layer 27a by a printing process, and then the transparent resin is cured. Thus, a second fluorescent layer 27b is formed on the first fluorescent layer 27a. That is, a fluorescent layer 27 with a structure of two layers having different light emission peak wavelengths is obtained.

When the fluorescent layer 27 is formed, as shown in FIG. 7B, because the resin 26 is buried in the trench 8, the fluorescent layer 27 does not penetrate into the trench 8. That is, the fluorescent layer 27 is formed in wafer state in which a plurality of semiconductor layers 5 divided by the trench 8 are connected via the resin 26 buried in the trench 8. Thus, the fluorescent layer 27 can be formed with a uniform thickness, and variation in chromatic characteristics can be suppressed.

The fluorescent layer with uniform thickness can be easily formed by performing the printing process on a relatively large and flat surface in a wafer state to form the fluorescent layer in a single process. This increases the accuracy of optical design, and this is also advantageous to downsizing.

Furthermore, because the fluorescent layer 27 is formed after the substrate 10 is removed from above the first major surface 11a, the substrate 10 does not exist between the first major surface 11a serving as a light extraction surface and the fluorescent layer 27, which serves to increase the light extraction efficiency.

Subsequently, by cutting along the trench 8, a semiconductor light emitting device divided into pieces is obtained. Because the substrate 10 has already been removed and furthermore the resin 26 is buried in the trench 8, dicing can be easily performed, and the productivity can be improved. Furthermore, because the first semiconductor layer 11 and the second semiconductor layer 12 do not exist in the trench 8, damage to these semiconductor layers at the time of dicing can be avoided. By cutting along the trench 8 filled with the resin 26, as shown in FIG. 1, the side surface (or end surface) 11c of the first semiconductor layer 11 in the device divided into pieces is covered and protected by the resin 26.

The semiconductor light emitting device may be divided into pieces by cutting at a point surrounding one chip (semiconductor layer) 5 as indicated by dot-dashed lines in FIG. 3. Alternatively, the device may be divided into pieces by cutting along the trench 8 surrounding multiple chips (semiconductor layers) 5 as indicated by double-dot-dashed lines.

The aforementioned processes prior to dicing are each performed collectively in wafer state, which eliminates the need of interconnecting and packaging for each device divided into pieces, enabling significant reduction of production cost. That is, interconnecting and packaging have already been finished in the device divided into pieces. Furthermore, it is easy to achieve downsizing in which the planar size of the individual device is close to the planar size of the bare chip (semiconductor layer 5). Moreover, wafer-level inspection can be performed. This can improve productivity, and consequently cost reduction is facilitated.

Figure 8:
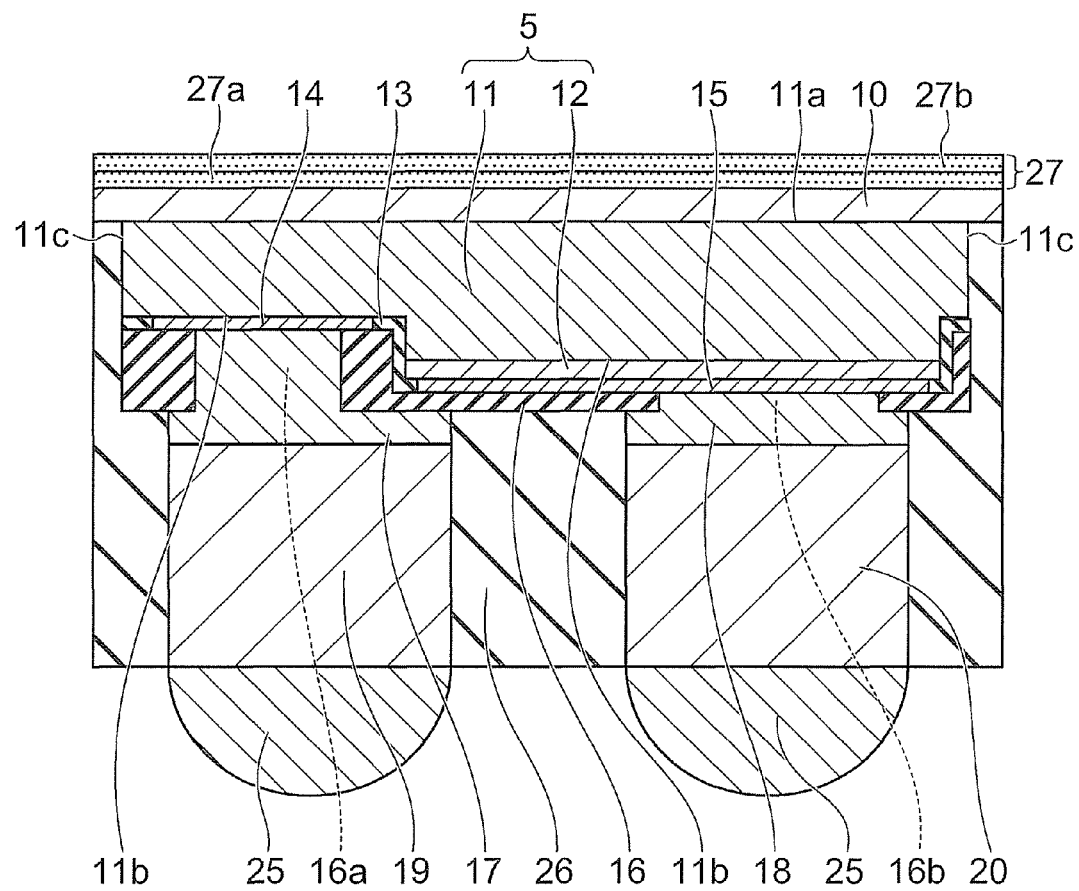
FIG. 8 is a schematic cross-sectional view of a semiconductor light emitting device of another embodiment.

Here, the substrate 10 may not be completely removed, but may be thinly ground and left on the first major surface 11a of the first semiconductor layer 11 as shown in FIG. 8. The fluorescent layer 27 is provided on the substrate 10 and opposed to the first major surface 11a via the substrate 10.

By thinning and leaving the substrate 10, it is possible to achieve higher mechanical strength, and hence a more reliable structure than the structure in which the substrate 10 is completely removed. Furthermore, the remaining substrate 10 can suppress warpage after divided into pieces, and it facilitates mounting on a circuit board and the like.

The material, size, shape, layout and the like of the substrate, semiconductor layer, electrode, interconnection, metal pillar, insulating film, and resin can be variously modified by those skilled in the art.

While certain embodiments have been described, these embodiments have been presented by way of example only, and are not intended to limit the scope of the inventions. Indeed, the novel devices and methods described herein may be embodied in a variety of other forms; furthermore, various omissions, substations and changes in the form of the devices and methods described herein may be made without departing from the spirit of the inventions. The accompanying claims and their equivalents are intended to cover such forms or modifications as would fall within the scope and spirit of the inventions.

The invention claimed is:

1. A semiconductor light emitting device comprising:
a semiconductor layer having a first major surface, a second major surface formed on an opposite side to the first major surface, and a light emitting layer;
a first electrode provided on the second major surface of the semiconductor layer;
a second electrode provided on the second major surface of the semiconductor layer;
an insulating film provided on a side of the second major surface of the semiconductor layer and including a first opening reaching the first electrode and a second opening reaching the second electrode;
a first interconnection provided on a surface of the insulating film on the opposite side to the semiconductor layer and in the first opening and connected to the first electrode;
a second interconnection provided on a surface of the insulating film on the opposite side to the semiconductor layer and in the second opening and connected to the second electrode;
a first metal pillar provided on a surface of the first interconnection on an opposite side to the first electrode;
a second metal pillar provided on a surface of the second interconnection on an opposite side to the second electrode;
a resin provided between the first metal pillar and the second metal pillar; and
a fluorescent layer facing to the first major surface of the semiconductor layer and including a plurality of kinds of fluorescent materials having different peak wavelengths of emission light.

2. The device of claim 1, wherein, among the plurality of kinds of fluorescent materials, a fluorescent material having a long peak wavelength of emission light is provided nearer to the first major surface of the semiconductor layer than a fluorescent material having a short peak wavelength of emission light.

3. The device of claim 1, wherein the fluorescent layer includes:
a first fluorescent layer provided on the first major surface of the semiconductor layer and containing a first fluorescent material; and
a second fluorescent layer provided on the first fluorescent layer and containing a second fluorescent material having a shorter peak wavelength of emission light than the first fluorescent material.

4. The device of claim 3, wherein the first fluorescent material contains a SiAlON compound, the SiAlON compound exhibiting a light emission peak at a wavelength ranging from 580 to 700 nm during excitation of the first fluorescent material caused by light with a wavelength of 250 to 500 nm.

5. The device of claim 3, wherein the second fluorescent material contains a SiAlON compound, the SiAlON compound exhibiting a light emission peak at a wavelength ranging from 490 to 580 nm during excitation of the second fluorescent material caused by light with a wavelength of 250 to 500 nm.

6. The device of claim 4, wherein the second fluorescent material contains a SiAlON compound, the SiAlON compound exhibiting a light emission peak at a wavelength ranging from 490 to 580 nm during excitation of the second fluorescent material caused by light with a wavelength of 250 to 500 nm.

7. The device of claim 1, wherein the fluorescent layer includes:
   a transparent resin transmissive to light emitted by the light emitting layer and the fluorescent materials; and
   the fluorescent materials dispersed in the transparent resin.

8. The device of claim 1, wherein each thickness of the first metal pillar and the second metal pillar is thicker than a thickness of a stacked body including the semiconductor layer, the first electrode, the second electrode, the insulating film, the first interconnection, and the second interconnection.

9. The device of claim 1, wherein a part of the resin covers a side surface of the semiconductor layer.

10. A method for manufacturing a semiconductor light emitting device, comprising:
   forming a semiconductor layer on a substrate, the semiconductor layer having a first major surface, a second major surface formed on an opposite side of the first major surface, and a light emitting layer;
   forming a first electrode and a second electrode on the second major surface of the semiconductor layer;
   forming an insulating film covering the first electrode and the second electrode on a side of the second major surface of the semiconductor layer;
   forming a first opening and a second opening in the insulating film, the first opening reaching the first electrode, the second opening reaching the second electrode;
   forming a first interconnection and a second interconnection on a surface of the insulating film on an opposite side to the semiconductor layer, the first interconnection connected to the first electrode via the first opening, the second interconnection connected to the second electrode via the second opening;
   forming a first metal pillar on a surface of the first interconnection on an opposite side to the first electrode and a second metal pillar on a surface of the second interconnection on an opposite side to the second electrode;
   forming a resin covering a periphery of the first metal pillar and a periphery of the second metal pillar; and
   forming a fluorescent layer including a plurality of kinds of fluorescent materials on the first major surface of the semiconductor layer.

11. The method of claim 10, wherein the forming of the fluorescent layer includes:
   forming a first fluorescent layer containing a first fluorescent material on the first major surface of the semiconductor layer; and
   forming a second fluorescent layer containing a second fluorescent material on the first fluorescent layer, the second fluorescent material having a shorter peak wavelength of emission light than the first fluorescent material.

12. The method of claim 10, wherein the forming of the fluorescent layer includes:
   supplying a transparent resin including the fluorescent materials dispersed onto the first major surface by a printing process; and
   curing the transparent resin supplied onto the first major surface.

13. The method of claim 10, wherein the first interconnection and the second interconnection are formed simultaneously by plating.

14. The method of claim 10, further comprising:
   removing the substrate after the forming the first metal pillar, the second metal pillar, and the resin.

15. The method of claim 10, further comprising:
   forming a trench separating the semiconductor layer into a plurality on the substrate.

16. The method of claim 15, further comprising:
   cutting along the trench to divide into pieces.

17. The method of claim 15, further comprising:
   burying a part of the resin in the trench in the forming of the resin; and
   cutting the resin buried in the trench to divide into pieces.

18. The method of claim 17, wherein the fluorescent layer is formed on the first major surface in a wafer state in which the plurality of semiconductor layers divided by the trench are connected via the resin buried in the trench.

19. The device of claim 1, wherein a contact area between the first interconnection and the first metal pillar is larger than a contact area between the first interconnection and the first electrode.

20. The device of claim 19, wherein a contact area between the second interconnection and the second metal pillar is larger than a contact area between the second interconnection and the second electrode.

21. The device of claim 1, wherein the semiconductor layer is formed on a substrate and separated from the substrate.

22. The device of claim 1, wherein a side surface of the light emitting layer is covered with an insulating film or a resin.

* * * * *